United States Patent
Norton et al.

(10) Patent No.: US 11,317,499 B2
(45) Date of Patent: Apr. 26, 2022

(54) LIGHTING RELAY PANEL FEATURES FOR IMPROVED SAFETY AND RELIABILITY

(71) Applicant: ABL IP Holding LLC, Atlanta, GA (US)

(72) Inventors: Mark Norton, Oxford, GA (US); Dalibor Zulim, Conyers, GA (US); Ryan Zaveruha, Stratford, CT (US); Frank Pelliccio, Gulford, CT (US); Richard Lee Westrick, Jr., Social Circle, GA (US)

(73) Assignee: ABL IP Holding LLC, Atlanta, GA (US)

( * ) Notice: Subject to any disclaimer, the term of this patent is extended or adjusted under 35 U.S.C. 154(b) by 299 days.

(21) Appl. No.: 16/722,104

(22) Filed: Dec. 20, 2019

(65) Prior Publication Data

US 2020/0128650 A1 Apr. 23, 2020

Related U.S. Application Data

(62) Division of application No. 15/909,152, filed on Mar. 1, 2018, now Pat. No. 10,757,769.

(Continued)

(51) Int. Cl.
*H05B 47/25* (2020.01)
*H02H 3/22* (2006.01)
(Continued)

(52) U.S. Cl.
CPC .............. *H05B 47/25* (2020.01); *H02H 3/22* (2013.01); *H02J 9/061* (2013.01); *H05B 41/36* (2013.01);
(Continued)

(58) Field of Classification Search
CPC .......... H02H 3/22; H02J 9/061; H05B 41/36; H01H 47/002
(Continued)

(56) References Cited

U.S. PATENT DOCUMENTS 4,629,946 A 12/1986 Amano et al.
4,845,580 A 7/1989 Kitchens
(Continued)

FOREIGN PATENT DOCUMENTS

| CN | 104582155 | 4/2015 |
|---|---|---|
| CN | 105098794 | 11/2015 |
| FR | 2609580 | 7/1988 |

OTHER PUBLICATIONS

U.S. Appl. No. 15/909,051, "Notice of Allowance", dated Jun. 7, 2018, 8 pages.
(Continued)

*Primary Examiner* — Kam Wan Ma
(74) *Attorney, Agent, or Firm* — Kilpatrick Townsend & Stockton LLP

(57) ABSTRACT

A lighting relay panel may include lower-cost features or components related to improved safety and reliability. In some cases, the relay panel includes a power supply capable of protecting the panel from high-voltage and high-current transients. A microcontroller may determine a power interruption based on a zero-cross signal received from the power supply, and may also configure latching relays during the interruption. In some implementations, the relay panel includes a relay sense circuit that is capable of receiving actuation signals from multiple relays connected to different phases of a power signal, and the microcontroller may synchronize or repeat the actuations based on a signal from the relay sense circuit. The microcontroller may generate relay addresses based on the relay positions within the relay panel. In some cases, the relay panel may include isolation circuits that are capable of providing an isolated control signal having an improved voltage range.

20 Claims, 7 Drawing Sheets

Related U.S. Application Data

(60) Provisional application No. 62/490,076, filed on Apr. 26, 2017.

(51) Int. Cl.

| | |
|---|---|
| *H05B 47/24* | (2020.01) |
| *H05B 47/165* | (2020.01) |
| *H02J 9/06* | (2006.01) |
| *H05B 41/36* | (2006.01) |
| *H02H 9/04* | (2006.01) |
| *H01H 47/00* | (2006.01) |
| *H01H 47/18* | (2006.01) |
| *G01R 31/327* | (2006.01) |

(52) U.S. Cl.
CPC ........... *H05B 47/165* (2020.01); *H05B 47/24* (2020.01); *G01R 31/3278* (2013.01); *H01H 47/002* (2013.01); *H01H 47/18* (2013.01); *H01H 2047/009* (2013.01); *H02H 9/042* (2013.01)

(58) Field of Classification Search
USPC ........................................................ 340/644
See application file for complete search history.

(56) References Cited

U.S. PATENT DOCUMENTS

| | | |
|---|---|---|
| 4,926,280 A | 5/1990 | Richter et al. |
| 5,055,962 A | 10/1991 | Peterson et al. |
| 5,117,178 A | 5/1992 | Roth |
| 5,267,120 A | 11/1993 | Graff et al. |
| 5,530,322 A | 6/1996 | Ference et al. |
| 5,555,150 A | 9/1996 | Newman, Jr. |
| 5,790,389 A | 8/1998 | Hua |
| 5,804,991 A | 9/1998 | Hu |
| 5,831,546 A | 11/1998 | Costa et al. |
| 5,838,077 A | 11/1998 | Chelcun et al. |
| 6,049,177 A | 4/2000 | Felper |
| 6,188,181 B1 | 2/2001 | Sinha et al. |
| 6,233,132 B1 | 5/2001 | Jenski |
| 6,239,960 B1 | 5/2001 | Martin |
| 6,459,557 B1 | 10/2002 | Haensgen et al. |
| 6,486,616 B1 | 11/2002 | Liu et al. |
| 6,870,326 B1 | 3/2005 | Stevens |
| 6,933,686 B1 | 8/2005 | Bishel |
| 7,019,468 B2 | 3/2006 | Deurloo et al. |
| 7,091,671 B2 | 8/2006 | Deurloo et al. |
| 7,336,463 B2 | 2/2008 | Russell et al. |
| 7,468,878 B2 | 12/2008 | Deurloo et al. |
| 7,933,108 B2 | 4/2011 | Tallam |
| 8,049,599 B2 | 11/2011 | Sutardja |
| 8,076,862 B2 | 12/2011 | Thirugnanasambandham |
| 8,093,820 B1 | 1/2012 | Stevens |
| 8,154,841 B2 | 4/2012 | Allen et al. |
| 8,164,428 B2 | 4/2012 | Sutardja |
| 8,203,276 B2 | 6/2012 | Shackle et al. |
| 8,310,163 B2 | 11/2012 | Chen |
| 8,324,761 B2 | 12/2012 | Elliott et al. |
| 8,344,646 B2 | 1/2013 | Xue et al. |
| 8,345,400 B2 | 1/2013 | Veskovic |
| 8,350,494 B2 | 1/2013 | Snook et al. |
| 8,390,214 B2 | 3/2013 | Van Laanen et al. |
| 8,559,154 B2 | 10/2013 | Li et al. |
| 8,593,079 B2 | 11/2013 | Sadwick et al. |
| 8,618,751 B2 | 12/2013 | Ostrovsky et al. |
| 8,755,944 B2 | 6/2014 | Elliott et al. |
| 8,853,967 B2 | 10/2014 | Wilcox et al. |
| 8,884,541 B2 | 11/2014 | Wu |
| 8,947,000 B2 | 2/2015 | Chen |
| 8,975,825 B2 | 3/2015 | Hu |
| 9,064,661 B2 | 6/2015 | Westrick, Jr. et al. |
| 9,076,616 B2 | 7/2015 | Oebser |
| 9,257,908 B2 | 2/2016 | Thompson et al. |
| 9,293,919 B2 | 3/2016 | Russell et al. |
| 9,307,588 B2 | 4/2016 | Li et al. |
| 9,345,112 B2 | 5/2016 | Chen |
| 9,370,057 B2 | 6/2016 | Saes et al. |
| 9,380,680 B2 | 6/2016 | Chen |
| 9,386,648 B2 | 7/2016 | Fassbender et al. |
| 9,432,214 B2 | 8/2016 | Lal et al. |
| 9,445,474 B2 | 9/2016 | Chen |
| 9,496,691 B2 | 11/2016 | Westrick, Jr. |
| 9,497,834 B2 | 11/2016 | Chen |
| 9,560,718 B2 | 1/2017 | Sadwick |
| 9,560,719 B2 | 1/2017 | Chen |
| 9,581,626 B2 | 2/2017 | Schwind |
| 9,608,533 B2 | 3/2017 | Ostrovsky et al. |
| 9,609,704 B2 | 3/2017 | Zotter |
| 9,622,325 B2 | 4/2017 | Chen |
| 9,622,328 B2 | 4/2017 | Chen |
| 9,648,702 B2 | 5/2017 | Chen |
| 9,648,704 B2 | 5/2017 | Chen |
| 9,655,179 B2 | 5/2017 | Brandt |
| 9,661,697 B2 | 5/2017 | Sadwick et al. |
| 10,129,950 B1 | 11/2018 | Gross et al. |
| 2002/0175641 A1* | 11/2002 | Andersen ............... H05B 47/22 315/312 |
| 2004/0109333 A1 | 6/2004 | D'Cunha |
| 2004/0169987 A1 | 9/2004 | Green |
| 2005/0259373 A1 | 11/2005 | Hoopes |
| 2006/0245129 A1 | 11/2006 | Bamburak |
| 2008/0018261 A1 | 1/2008 | Kastner |
| 2010/0039794 A1 | 2/2010 | Ghanem et al. |
| 2011/0178650 A1* | 7/2011 | Picco .................... H05B 47/18 700/295 |
| 2012/0293009 A1 | 11/2012 | Kim et al. |
| 2013/0083444 A1 | 4/2013 | Barnes et al. |
| 2013/0127353 A1 | 5/2013 | Athalye et al. |
| 2013/0175931 A1 | 7/2013 | Sadwick |
| 2013/0211615 A1 | 8/2013 | Zikes et al. |
| 2013/0286528 A1 | 10/2013 | Murfett et al. |
| 2013/0313995 A1 | 11/2013 | Sadwick |
| 2013/0320883 A1 | 12/2013 | Zheng |
| 2013/0342950 A1 | 12/2013 | Westrick, Jr. et al. |
| 2014/0177304 A1 | 6/2014 | Sadwick |
| 2014/0265899 A1 | 9/2014 | Sadwick |
| 2014/0268474 A1 | 9/2014 | Steiner et al. |
| 2015/0048762 A1 | 2/2015 | Yang et al. |
| 2015/0170860 A1 | 6/2015 | Ahmed et al. |
| 2016/0035524 A1 | 2/2016 | Zulim et al. |
| 2016/0042901 A1 | 2/2016 | Oosterwal et al. |
| 2016/0057824 A1 | 2/2016 | Hu et al. |
| 2016/0057825 A1 | 2/2016 | Hu et al. |
| 2016/0092388 A1 | 3/2016 | Sorenson et al. |
| 2016/0252367 A1 | 9/2016 | Banhegyesi et al. |
| 2016/0353555 A1 | 12/2016 | Chen et al. |

OTHER PUBLICATIONS

U.S. Appl. No. 15/909,152, "Non-Final Office Action", dated May 28, 2019, 8 pages.

U.S. Appl. No. 15/909,152, "Notice of Allowance", dated Sep. 23, 2019, 8 pages.

U.S. Appl. No. 16/722,058, Notice of Allowance dated Oct. 29, 2021, 14 pages.

* cited by examiner

LIGHTING RELAY PANEL FEATURES FOR IMPROVED SAFETY AND RELIABILITY

RELATED APPLICATIONS

This application is a divisional application of U.S. application Ser. No. 15/909,152, filed Mar. 1, 2018 and entitled Lighting Relay Panel Features for Improved Safety and Reliability, which claims priority to U.S. provisional application No. 62/490,076 for "Protection circuit for AC-powered device" filed Apr. 26, 2017, which is incorporated by reference herein in its entirety. The present application is related to U.S. Ser. No. 15/909,051 filed concurrently with U.S. application Ser. No. 15/909,152, which is incorporated by reference herein in its entirety. The present application is related to U.S. application Ser. No. 16/722,058 filed on Dec. 20, 2019, which is incorporated by reference herein in its entirety.

FIELD OF THE INVENTION

This disclosure relates generally to the field of lighting controls, and more specifically relates to power management, safety, and reliability in a lighting relay panel.

BACKGROUND

A lighting relay panel may receive control signals from various lighting controls or user interface devices. In addition, the lighting relay panel may direct the received signals to various components within the lighting relay panel (such as relays, microcontrollers, or signal filtering circuits), or to components external to the relay panel (such as additional lighting control devices or lighting fixtures). In some cases, the lighting relay panel may include additional components related to safety and reliability, such as a surge protector, a filter, a brownout detection circuit, or other suitable components.

In some cases, the lighting relay panel provides functions related to safety, circuit protection, control signal and electrical integrity, reliability, and analog or digital control of lighting fixtures. It is desirable for a lighting relay panel to provide such functions reliably, and at a relatively low cost.

In some cases, a lighting relay panel is tested to determine its performance or safety under high-voltage or high-current power events. Designing an AC-powered device, such as a power supply, that can withstand high-voltage transients and surges is a challenge. One technique that has been used involves adding protective devices to the front end. The protective devices may include varistors (e.g., metal oxide varistors), transient voltage suppressors, gas discharge tube suppressors, spark gaps, or other suitable techniques or devices. The selection of the protective devices, as well as the design of the circuits that include the protective devices, need to be capable of passing applicable surge tests and dielectric voltage-withstand tests (e.g., "high potential" or "hipot" tests). A surge test evaluates a product's ability to withstand high voltage or current transient spikes. For example, a surge test may test a product's ability to withstand a 6 kV, 3 kA voltage and current combination waveform caused by a lighting event. A hipot or dielectric voltage withstand test evaluates a product's ability to withstand a high voltage (50/60 Hz or DC) voltage applied between line voltage (hot and/or neutral, L1/L2) and earth ground. It may be desirable for a power supply to include a protection circuit that is capable of withstanding one or both of a hipot test and a surge test.

In a conventional relay panel, relays with different actuation currents or that are connected to different phases of a power signal may have actuations that are staggered over time. However, staggering the relay actuations may slow a response time when multiple relays are being actuated. Therefore, it is desirable to synchronize actuation of multiple relays, including relays that are connected to different phases of a power signal. In some conventional systems, multiple relays are actuated using separate actuation circuits for each relay. However, the separate actuation circuits require increased space (e.g., on a printed circuit board) and cost for the components in the multiple actuation circuits. Therefore, it is also desirable to develop a circuit that is capable of sensing relay actuation for multiple relays, and further capable of actuating multiple relays synchronously.

It may be desirable for each relay connected to a relay control board to have an address that is unique compared to other relays that are included in the lighting relay panel. Assigning unique addresses to relays included in a lighting relay panel may improve reliability of the panel's operation, such as by providing signals (such as configuration, control, or power signals) to only the relay(s) to which the signals are addressed. In addition, it may be desirable for the addresses of relays included in a lighting relay panel to be automatically determined, such as by a microcontroller on a relay control board. Automatic addressing of relays in a panel may reduce the time related to installation and configuration of the lighting relay panel, and may reduce sources of user frustration or user errors.

Existing techniques for 0-10V dimming include providing a reference voltage and an isolated control signal. In some conventional systems, a reference voltage is generated by a single-transistor optocoupler or a digital-to-analog converter. However, the single-transistor optocoupler may generate varying voltage levels (e.g., "ripple" voltage) on the reference voltage, resulting in the reference voltage varying over time. In addition, the digital-to-analog converter may have a relatively high cost, leading to an overall increase in expense for this existing technique.

Existing techniques for providing power or control signals to lighting system components may include using one or more electrically held relays. An electrically held relay may return to a known state if the power is interrupted, according to the type of electrically held relay used (e.g., normally open, normally closed, momentary operation). The electrically held relays may be installed in the panel, such as during manufacturing. However, the type of electrically held relay that is installed may be inappropriate for some uses, and a user may wish to configure (or reconfigure) a use of the relay after the panel is installed in a lighting system at a premises. It may be advantageous for the relays to be configurable by the user, such as during or after installation of the relay panel at a premises. In addition, it may be advantageous for the relays to be configurable via a configuration signal, such as from a microcontroller, to enable configuration without physically replacing a type of relay.

SUMMARY

According to certain implementations, a relay panel, such as for a lighting control system, includes one or more components capable of performing functions related to power management, safety, reliability, or system protection. In some cases, the relay panel may include a power supply with one or more components capable of reducing or diverting transient voltage or transient current events. In addition, the relay panel may include latching relays that may be configured to maintain a state, such as during brownouts or other power events.

In addition, the relay panel may include a relay control board capable of configuring relays within the relay panel, or performing operations related to performance of the relay panel. In some cases, the relay control board may include a relay sense circuit that is capable of synchronously testing multiple relays, such as for unresponsive relay contacts, or testing multiple relays that are connected to different phases of an AC power signal. In addition, a microcontroller on the relay control board may be capable of generating addresses for the relays within the panel, and providing the generated addresses to other components in the lighting system, such as a controller or input device. In addition, the relay control board may include optocoupler isolation circuits, such as to provide an isolated control signal to other components in a lighting control system.

These illustrative embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

Features, embodiments, and advantages of the present disclosure are better understood when the following Detailed Description is read with reference to the accompanying drawings, where.

DETAILED DESCRIPTION

In some implementations, a lighting relay panel includes a power supply, one or more relays, and a relay control board. The lighting relay panel may receive control signals that describe operation of a lighting component, such as a lighting controller or lighting fixture. The control signals may be received by the relay panel, communicated via the relays, and provided to the lighting component by the relay panel. In some cases, the relay panel may modify the control signals, such as by adjusting a waveform of the signal. In addition, the relays may prevent communication of the control signals (e.g., by opening the relay) in response to an operating condition of the relay panel, such as a system reset. Furthermore, the relay panel may detect irregular operating conditions, such as loss of power or power surges, and adjust a state of the relays in response to the irregular condition. For example, in response to a power surge, one or more of the relays may be opened.

Figure 1:
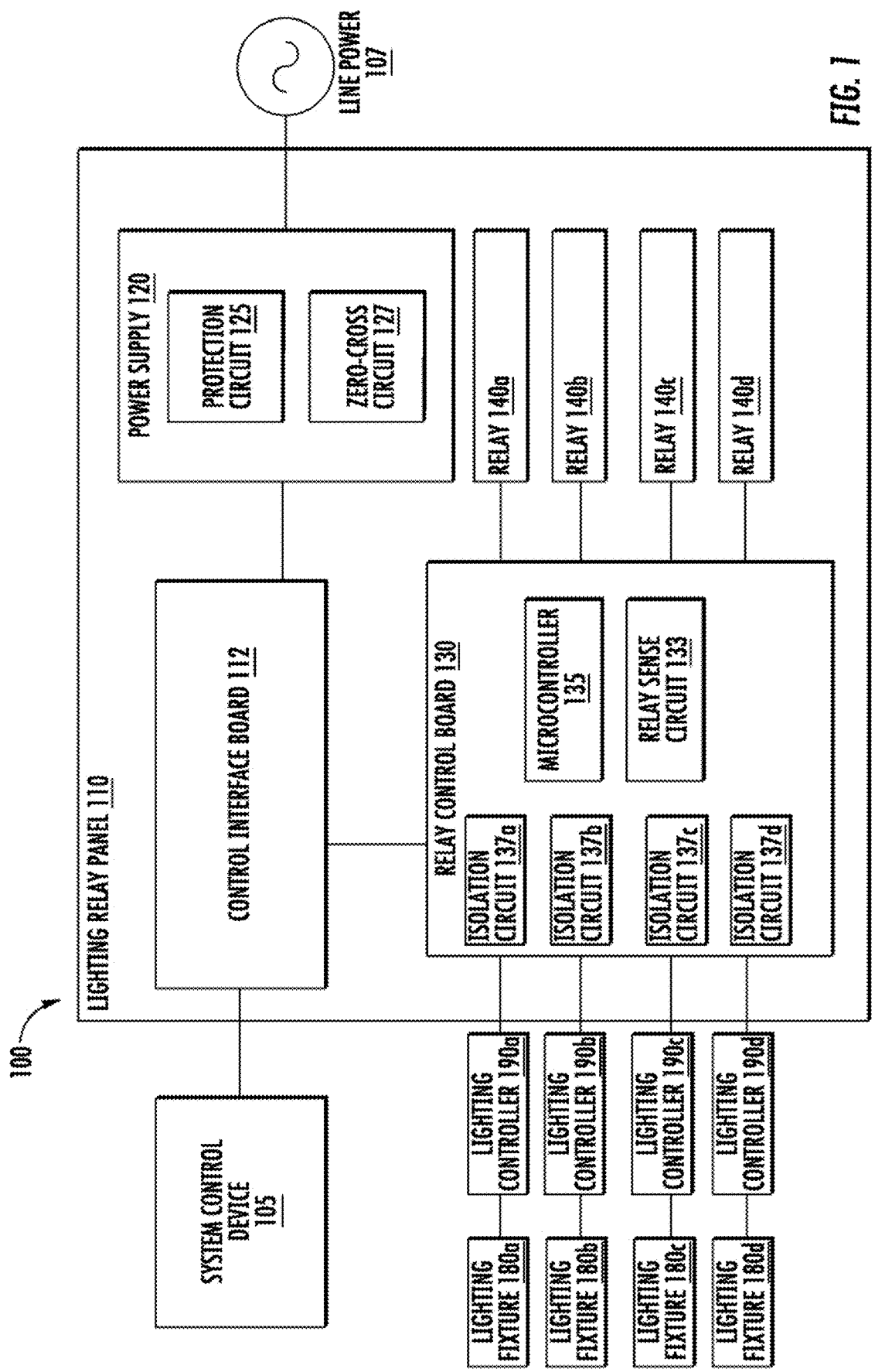
FIG. 1 is a block diagram depicting an example of a lighting system including a relay panel, according to some implementations.

FIG. 1 is a block diagram depicting an example of a lighting system 100. The lighting system 100 may include a system control device 105, a lighting relay panel 110, one or more lighting fixtures (such as lighting fixtures 180*a*-180*d*), and one or more lighting controllers (such as lighting controllers 190*a*-190*d*). Data describing an overall behavior of the lighting system 100, such as inputs received on input devices (e.g., light switches), operations generated by a lighting program, or instructions generated in response to sensor data (e.g., daylight sensors) may be provided by the one or more system control device(s) 105. The data may describe operational information indicating a desired output(s) of one or more of the lighting fixtures 180*a*-180*d*, such as an intensity, a color, or other quality of light generated by the lighting fixtures 180*a*-180*d*. The data (or signals based on the data) may be received by the lighting controllers 190*a*-190*d*, which each provide instructions to, respectively, the lighting fixtures 180*a*-180*d*. Based on the instructions provided by the lighting controllers 190*a*-190*d*, the lighting fixtures 180*a*-180*d* produce the desired light output (or a modification of the desired light output).

In some cases, the lighting relay panel 110 may receive electrical signals based on the data from the system control device 105. The relay panel 110 may modify the signals, and provide the modified signals to the lighting controllers 190*a*-190*d*. The relay panel 110 may modify the signals to improve safety, performance, or reliability of the lighting system 100. Example modifications include (without limitation) filtering power received from an AC line power supply 107, to improve stability of electrical signals and safety; adjusting a voltage or waveform of a digital signal to one of the lighting controllers 190*a*-190*b*, to improve performance of the lighting controller; or configuring components included in the relay panel 110, to improve reliability and ease of use for the lighting system 100.

The lighting relay panel 110 may include one or more of a control interface board 112, a power supply 120, one or more relay control boards 130, and one or more relays 140*a*-140*d*. In some cases, the power supply 120 includes a protection circuit 125 and a zero-cross circuit 127. The power supply 120 may modify a voltage of the power received from the line power supply 107 (e.g., modified to 24V). In addition, the protection circuit 125 may provide protection against irregularities in the AC line power, such as surge events or high voltage events. Furthermore, the zero-cross circuit 127 may monitor the AC line power, and provide information indicating zero-crossings of the AC power signal. In some cases, the zero-crossing information may be used to determine one or more of a timing for a relay actuation, a brownout or blackout event, or a configuration of one or more of the relays 140*a*-140*d*.

Signals based on the data from the system control device 105 may be received by the control interface board 112, which may provide the signals to the relay control board(s) 130. The relay control board 130 may include a microcontroller 135, a relay sense circuit 133, one or more isolation circuits, such as the isolation circuits 137*a*-137*d*, and one or more interfaces, such as controller interfaces for connecting to the lighting controllers 190*a*-190*d*, relay interfaces for connecting to the relays 140*a*-140*d*, or data interfaces for connecting to the control interface board 112 or to additional relay control boards. In some cases, the isolation circuits 137a-137d may each include one or more optocouplers.

In some cases, the microcontroller 135 is configured to perform operations, such as operations based on programmed instructions encoded in a memory of the microcontroller 135. The microcontroller 135 may perform operations related to configuring one or more components of the lighting relay panel 110. For example, the microcontroller 135 may configure a state of one or more of the relays 140a-140d (e.g., an open state, a closed state, momentary operation). In addition, the microcontroller 135 may generate an address for one or more of the relays 140a-140d, such as an address that uniquely identifies a particular relay within the lighting relay panel 110.

In addition, each of the relays 140a-140d may receive one or more signals for one or more component associated with the relay (e.g., control signals, power signals). In addition, each of the relays 140a-140d may enable or disable a respective connection to the associated components. For example, the relay 140a may receive a signal that is related to the relay 140a (e.g., based on the relay's address) or a component associated with the relay 140a, such as lighting controller 190a or lighting fixture 180a. Based on a state of the relay 140a (e.g., open state, closed state, momentary operation), a connection to the associated component may be enabled or disabled. The relays 140a-140d may be configured (e.g., by the microcontroller 135) to enter or maintain a state responsive to power events, such as brownout or reset events. In some cases, each of the relays 140a-140d has a particular configuration to either enable or disable the connection to the associated component responsive to a power event. For example, relay 140a may have a first configuration to enter or maintain an open state upon a reset event, such that a connection to lighting controller 190a is disabled, and signals are not provided to the lighting controller 190a during (or after) the reset event. In addition, relay 140b may have a second configuration for a closed state upon the reset event, such that a connection to lighting controller 190b is enabled, and signals are provided to the lighting controller 190b.

In some implementations, the relay sense circuit 133 determines an actuation delay based on an output received from one or more of the relays 140a-140d. For example, the relay sense circuit 133 may determine a time difference between a control signal sent to the relay 140d (e.g., to change from an open to a closed state) and an output signal based on the state of the relay 140d (e.g., an open or closed state). Based on the actuation delay, the relay sense circuit may determine that the relay 140d is unresponsive (e.g., disconnected, welded open or closed). In some cases, the microcontroller 135 may perform one or more functions of the relay sense circuit 133.

In some cases, the isolation circuits 137a-137d, may receive data from the system control device 105, such as via a respective one of the relays 140a-140d. In addition, the isolation circuits may provide an isolated signal based on the received data to a lighting component, such as the lighting controllers 190a-190d. For example, isolation circuit 137a may receive, via the relay 140a, a portion of the data from the system control device 105. The portion of data may include a control signal intended for the lighting controller 190a. The isolation circuit 137a may generate an isolated signal based on the control signal and provide the isolated signal to the lighting controller 190a. In some cases, the isolated signal has an adjusted waveform that is based on a waveform of the control signal, such as an adjusted waveform that includes content of the control signal and omits electrical characteristics that are unrelated to the content (e.g., interference, offset voltages).

Protection Circuit for AC-Powered Device

In some implementations, a lighting relay panel may include a power supply, such as the power supply 120 described in regards to FIG. 1. The power supply may receive power from an AC line source with characteristics such as a frequency (e.g., 60 Hz, 50 Hz) and a voltage (e.g., 120V, 240V, 277V). In some cases, the characteristics of the AC line source may vary from a nominal value. For example, a voltage of the AC line source may vary from a nominal voltage of 120V, such as due to power surges, lightning strikes, high-voltage transients, or other events. The power supply in the lighting relay panel may include a protection circuit, such as the protection circuit 125 described in FIG. 1. In some cases, the protection circuit may reduce variations in AC line voltage. In addition, the protection circuit may perform under circuit tests (e.g., tests by governmental agencies and/or independent testing agencies) that indicate a rating or a performance of the protection circuit. For example, the protection circuit may be capable of passing one or more of a surge test or a dielectric voltage-withstand ("high potential" or "hipot") test. A surge test evaluates a product's ability to withstand high voltage transient spikes or current transient spikes (e.g., "transients"), such as a voltage and current combination waveform (e.g., 6 kV, 3 kA) caused by a lighting strike. A hipot test evaluates a product's ability to withstand a high voltage (e.g., 50/60 Hz or DC) voltage applied between line voltage (hot and/or neutral, L1/L2) and earth ground. In some cases, a protection circuit including a metal oxide varistor ("MOV") may reduce variations in the AC line voltage, or improve performance under a surge test or a hipot test.

Figure 2:
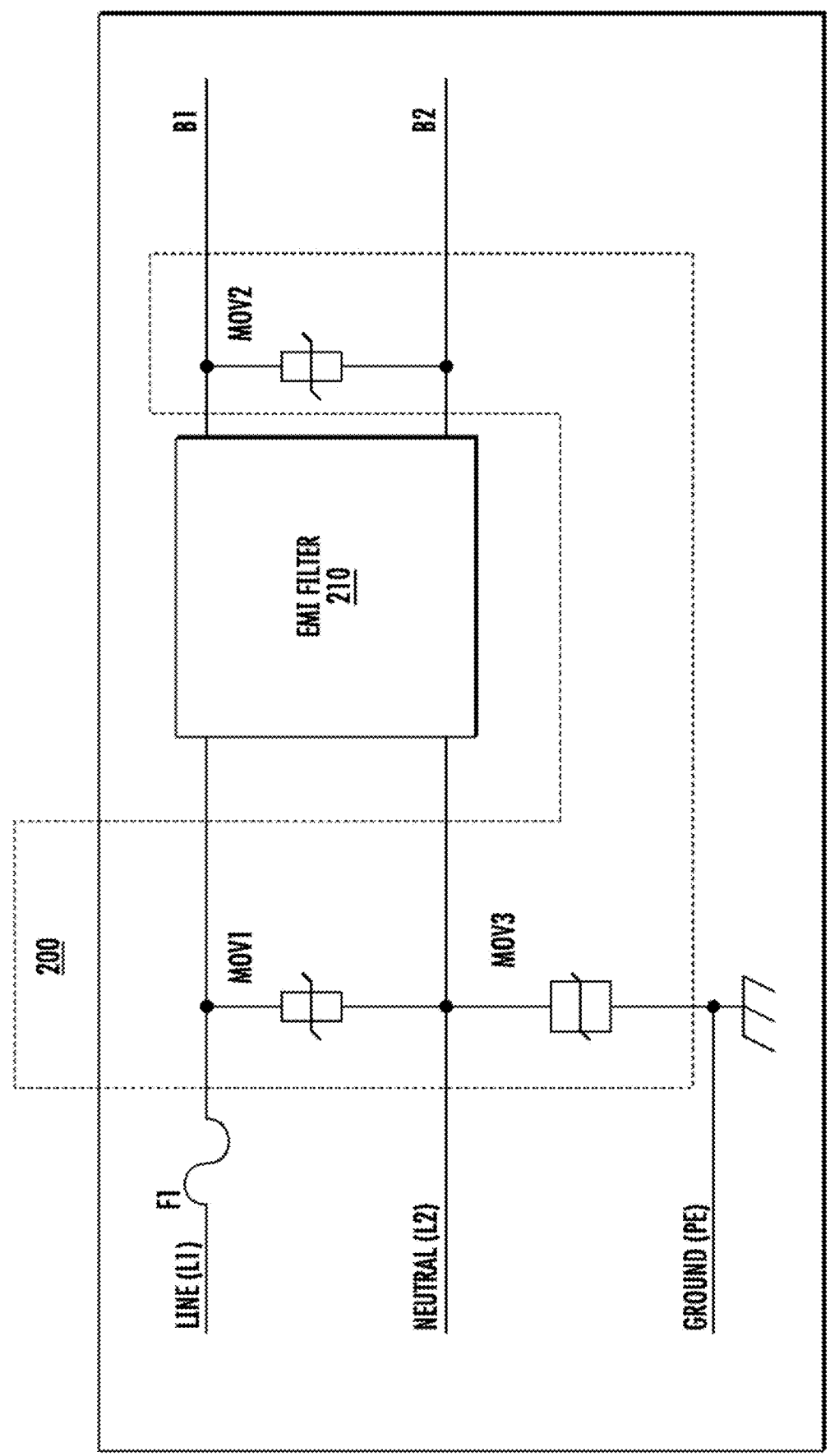
FIG. 2 is a block diagram depicting an example of a protection circuit capable of satisfying both surge and hipot circuit immunity requirements, according to some implementations.

FIG. 2 includes a block diagram depicting a protection circuit 200 capable of satisfying both surge and hipot circuit immunity requirements, such as to pass a surge test or a hipot test. The protection circuit 200 may also be referred to as a front end filter, surge protection circuit, or surge suppression circuit. The protection circuit 200 may be connected between connection points L1, L2, and PE associated with a line power input (such as an input from line power 107 described in regards to FIG. 1), and connection points B1 and B2 associated with a bridge rectifier. In some cases, the protection circuit 200 may include one or more MOVs, such as MOV1, MOV2, and MOV3. MOV1 may be connected on the line side of an EMI filter 210 between a hot or line input of the line power, such as connection point L1, and a neutral input, such as connection point L2. In addition, MOV2 may be connected on the rectifier side of the EMI filter 210 between a hot connection point, such as connection point B1, and a neutral connection point, such as connection point B2. MOV3 may be connected on the line side of the EMI filter 210 between a neutral input, such as connection point L2, and a ground input, such as connection point PE. In one implementation, MOV1 and MOV2 may have similar voltage ratings (e.g., 320 VAC), while MOV3 may have a higher voltage rating (e.g., 1100 VAC). For example, and not by way of limitation, MOV1 and MOV2 may be recognized by a testing agency as MOVs with a continuous AC voltage rating of 320 VAC and a peak current rating of 6 kA, and MOV3 may be recognized by a testing agency as an MOV with a continuous AC voltage rating of 1,100 VAC and a peak current rating of 4.5 kA. In one implementation, MOV one or MOV 2 may be selected as a Maida D69ZOV321RA90, and MOV 3 may be selected as a Bourns MOV-14D182K, but other implementations are possible.

In some cases, MOV1 and MOV2 suppress transients between the hot and neutral inputs of the line power, such as between connection points L1 and L2. In addition, MOV3, together with MOV1 and MOV2, suppresses transients between the ground input and the hot or neutral inputs, such as between connection points PE and one or both of L1 or L2. In some implementations, when there are high-voltage transients or surges between the hot and neutral inputs, MOV1 and MOV2 may conduct and absorb the transient energy. In addition, MOV1 may shunt the majority of the surge current. However, the surge current is associated with a high clamp voltage, which may damage the downstream components. In addition, MOV2 may reduce the surge voltage at the input of the bridge rectifier (e.g., connection points B1, B2) to protect the downstream components. For example, the output voltage of the bridge rectifier may be clamped to less than 730 VDC (e.g., peak value). In some cases, a continuous AC voltage rating of MOV1 and MOV2 (e.g., 320 VAC) may be selected to be in a non-conducting state under normal conditions, such as receiving line power without transient or surge events.

In some cases, MOV3 suppresses high-voltage transients and surges between neutral and ground inputs of the line power, such as between connection points L2 and PE. In addition, MOV3 works in conjunction with MOV1 and MOV2 to suppress high-voltage transients and surges between line and ground inputs, such as between connection points L1 and PE. In some cases, the continuous AC voltage rating of MOV3 may be selected to be high enough to pass the dielectric voltage withstand or hipot test (e.g., 1100 VAC).

In addition, to MOV1, MOV2, and MOV3, FIG. 2 illustrates an optional EMI filter 210. In some implementations, the EMI filter 210 may be included in the protection circuit 200 and may include any type of EMI filter design. In some implementations, the EMI filter 210 may be omitted from the protection circuit 200. FIG. 2 also illustrates a fuse F1. The fuse F1 may be placed between the line input and one or more of MOV1 or MOV2, so that it can open in case there is a short circuit (e.g., in case MOV1 or MOV2 shorts out). In one implementation, a Littelfuse Slo-Blo fuse (e.g., a Littlefuse 0209007.MXEP) is used so the fuse F1 does not open during a surge test, but other implementations are possible.

Figure 3:
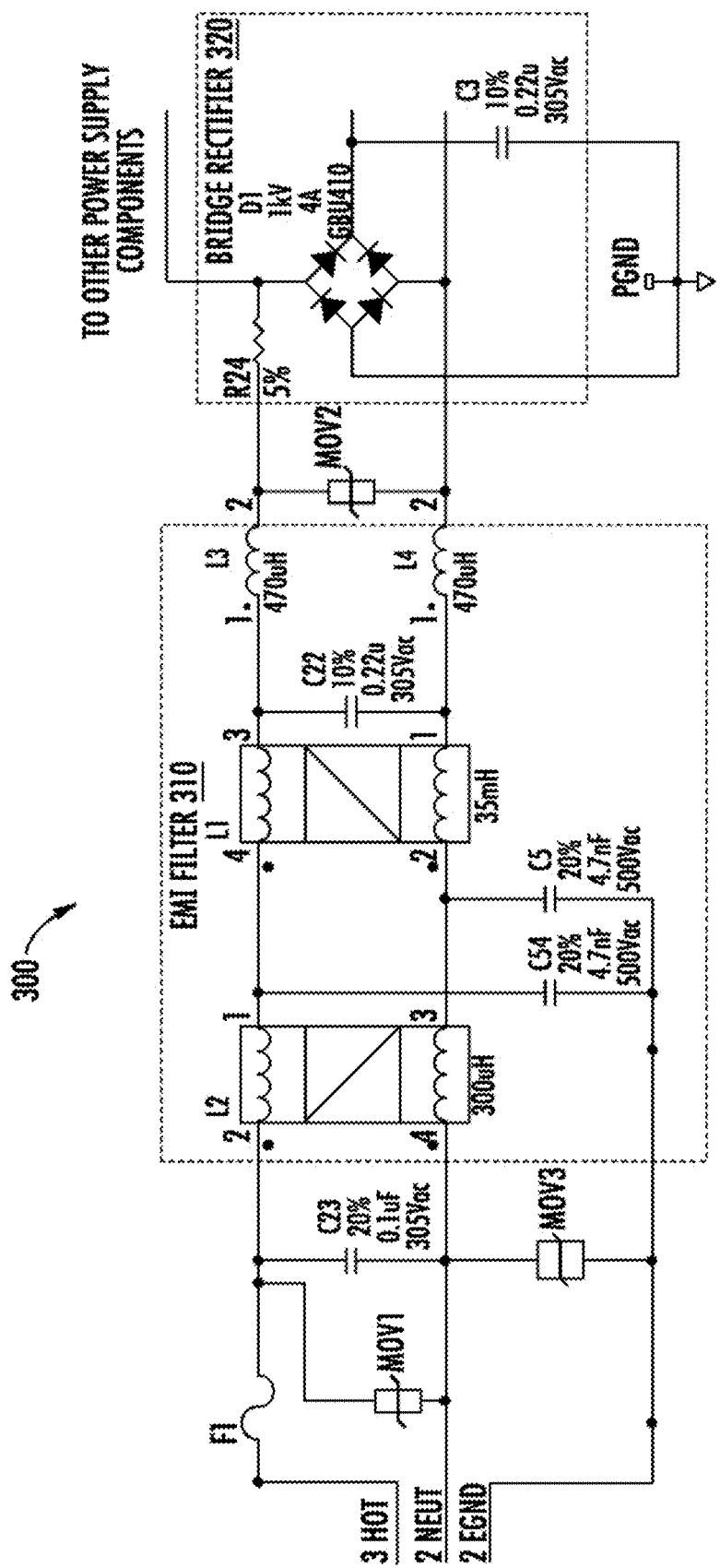
FIG. 3 is a block diagram depicting an example of a power supply circuit, including a protection circuit, for a relay panel, according to some implementations.

FIG. 3 illustrates a diagram of a circuit 300 in a power supply for a relay panel. In some implementations, the circuit 300 includes a protection circuit, such as a protection circuit including one or more of MOV1, MOV2, or MOV3, as described in regards to FIG. 2. In some cases, the circuit 300 includes an EMI filter 310. The EMI filter 310 may include two capacitors, C5 and C54. In some cases, the capacitor C5 and C54 may be high voltage capacitors (e.g., class-Y safety capacitors) and may provide EMI filtering. In addition, the EMI filter 310 may include additional components, such as capacitor C22, or inductive components L1, L2, L3, or L4. In some implementations, the circuit 300 may also include additional components, such as a capacitor C23, a fuse F1 (e.g., as described in regards to FIG. 2), or a bridge rectifier 320. In some cases, the bridge rectifier 320 includes a resistor R24, a capacitor C3, and one or more diodes D1 arranged in a bridge configuration.

Although FIG. 3 depicts an implementation where the protection circuit 300 is used in a power supply for a lighting relay panel, the protection circuit 300 may be used in other implementations, including, but not limited to, an LED driver or a power supply for another type of load.

Synchronized Relay Sense Circuit

In a relay control board, such as the relay control board 130 described in regards to FIG. 1, a relay sense circuit, such as relay sense circuit 133, may be used to determine an actuation time of one or more relays. However, the relays connected to the relay control board may have different characteristics, such as different actuation currents used to change the state of the relay. In conventional systems, actuation times of relays with various characteristics may be determined by staggering the actuation of the relays over time. However, staggering the relay actuations may slow a response time when multiple relays are being actuated. Therefore, it is desirable to synchronize actuation of multiple relays. In some conventional circuits, separate relay sense circuits are used to determine the actuation time of multiple relays, such as one sense circuit for each relay. However, the separate relay sense circuits require increased space (e.g., on a printed circuit board) and cost for the components in the multiple relay sense circuits. Therefore, it is also desirable to develop a common relay sense circuit that is capable of sensing multiple relay actuations of multiple relays. In some cases, it may also be desirable to use data received from the common relay sense circuit to control actuations of the multiple relays.

Figure 4:
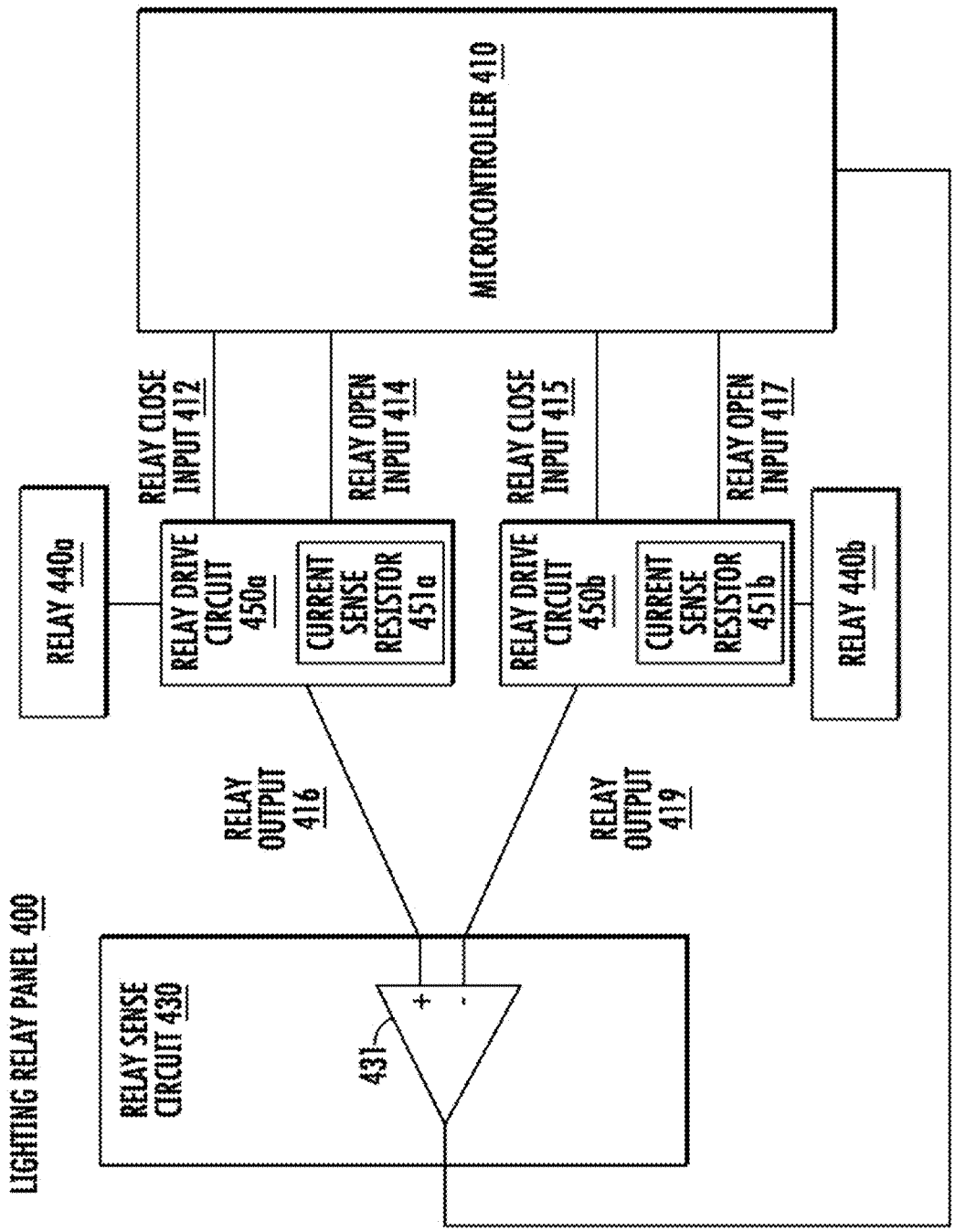
FIG. 4 is a block diagram depicting an example of a lighting relay panel that includes a relay sense circuit, according to some implementations.

FIG. 4 includes a block diagram depicting an example of a lighting relay panel 400 that includes a relay sense circuit 430, a microcontroller 410, and one or more relays, such as relays 440a and 440b. In some cases, the microcontroller 410 and the relay sense circuit 430 are included on a relay control board, such as depicted in regards to FIG. 1. In addition, the relay panel 400 includes one or more relay drive circuits respectively associated with each of the relays, such as relay drive circuits 450a and 450b respectively associated with relays 440a and 440b. The relay drive circuits 450a and 450b may be separate components, such as components included on the relay control board, or may be included in other components, such as sub circuits included within microcontroller 410 or within the respective relays 440a and 440b.

In some implementations, each of the relay drive circuits 450a and 450b include a relay close input, a relay open input, and a relay output. The relay close inputs and relay open inputs may be connected to outputs (e.g., pins) on the microcontroller 410. For example, the relay drive circuit 450a may receive, from the microcontroller 410, a signal indicating a closure of the relay 440a on the relay close input 412 and/or a signal indicating an opening of the relay 440a on the relay open input 414. In addition, the relay drive circuit 450b may receive, from the microcontroller 410, a closure signal for the relay 440b on the relay close input 415 and/or an opening signal for the relay 440b on the relay open input 417.

In addition, each of the relay drive circuits 450a and 450b may each include a current sense resistor, such as the respective current sense resistors 451a and 451b. The current sense resistors 451a and 451b may capable of detecting a current received from the respective relay associated with each relay drive circuit. Based on the detected current, each of the relay drive circuits 450a and 450b may determine a state of the respective relays 440a and 440b. In some cases, the current sense resistors 451a and 451b may each have a respective value that is based on a maximum rated current of an actuator of the respective associated relay.

In addition, the relay drive circuits 450a and 450b may each generate a signal indicating a state (e.g., open, closed) of the relay associated with the respective relay drive circuit. The signals indicating the state of the respective relays may be provided by the relay drive circuits to the relay sense circuit 430 via one or more relay outputs. For example, the relay output 416 from the relay drive circuit 450a may provide a first signal indicating a state of the associated relay 440a. In addition, the relay output 419 from the relay drive circuit 450b may provide a second signal indicating a state of the associated relay 440b. The relay outputs 416 and 419 may be provided to respective inputs of the relay sense circuit 430.

In the relay panel 400, signals received via the relay outputs 416 and 419 may be provided to inputs of an op amp 431 included in the relay sense circuit 430. FIG. 4 depicts the positive input of the op amp 431 as receiving signals from the relay output 416, but other implementations are possible. The op amp 431 may produce an output based on the signals received from the relay drive circuits 450a and 450b, such as an output indicating a current through one or more of the relays 440a and 440b. In some cases, the output of the op amp 431 may be connected to an output of the relay sense circuit 430.

In some implementations, the microcontroller 410 may receive from the relay sense circuit 430 a signal indicating the output of the op amp 431. Based on the signal indicating the op amp output, the microcontroller 410 may determine an actuation delay for one or more of relays 440a or 440b. For example, the microcontroller may provide a control signal to the relay drive circuit 450a, such as a closure signal via the close input 412 or an opening signal via the open input 414. The microcontroller 410 may receive an output signal from the relay sense circuit indicating a current (or a change in current) detected by the op amp 431. Based on the control signal and the output signal, the microcontroller 410 may determine a time difference between providing the control signal and receiving the output signal. In addition, the microcontroller 410 may store (e.g., in a memory component) information describing the relays 440a or 440b. For example, the microcontroller 410 may store data describing a first actuation delay associated with relay 440a and a second actuation delay associated with the relay 440b.

In addition, the microcontroller 410 may provide synchronized control signals to the relay drive circuits 450a and 450b. For example, the microcontroller 410 may synchronize the control signals based on a zero-crossing point in a received AC power signal (such as a zero-crossing determined by the zero-cross circuit 127 described in regards to FIG. 1). In some cases, the microcontroller 410 may provide the control signals simultaneously (or nearly simultaneously), such as at a particular time or window of time corresponding to a zero-crossing point of the AC power signal. In addition, the microcontroller 410 may provide the control signals at multiple synchronized times, such as at multiple times or windows of time corresponding to multiple zero-crossing points. For example, the microcontroller 401 may provide a first control signal to the relay drive circuit 450a, and a second control signal to relay drive circuit 450b, such that the actuations of the relay 440a and the relay 440b are staggered (e.g., across subsequent cycles of the AC power signal).

In some implementations, one or more of the relays of the lighting relay panel 400 may receive power from one or more different phases of the AC power signal. For example, the relays 440a and 440b may each be connected to an AC power source (such as the line power 107 described in regards to FIG. 1). The relay 440a may be connected to a first phase of the AC power source. In addition, the relay 440b may be connected to a second phase of the AC power source. The microcontroller 410 may synchronize control signals for the relays 440a and 440b based on one or more zero-crossing points of the AC power signal received from the source. For example, based on an input signal received from a zero-cross detection circuit, the microcontroller 410 may determine multiple phases of the AC power signal, such as a first phase at the detected zero-cross point and a second phase lagging from the detected zero-cross point (e.g., lagging by 90 degrees). In addition, the microcontroller may provide a first control signal to the relay 440a based on the first phase and the second control signal to the relay 440b based on the second phase.

In some cases, the microcontroller 410 may generate one or more additional control signals based on a signal received via the output of the relay sense circuit 430. For example, the microcontroller 410 may provide a closure signal for the relay 440a, via the relay close input 412. In some cases, the relay 440a may remain open after receiving the closure signal (e.g., the relay contacts are stuck, the relay is welded open). In such cases, the microcontroller 410 may receive an output signal from the relay sense circuit 430 indicating that the relay 440a is open. In addition, the microcontroller 410 may determine, based on the output from the relay sense circuit 430, that the relay 440a has remained open for a period of time longer than an actuation delay associated with the relay 440a. For example, the microcontroller 410 may compare the output from the relay sense circuit 430 to stored information indicating an actuation delay associated with the relay 440a. Based on the comparison, the microcontroller 410 may determine that the relay 440a has remained open longer than the associated actuation delay. In addition, the microcontroller 410 may generate an additional closure signal on the relay close input 412, such as to overcome the relay 440a's unresponsive condition (e.g., to close relay contacts that are stuck open).

In addition, the additional control signals generated by the microcontroller 410 may be opening signals, such as in response to an output signal from the relay sense circuit 430 indicating that the relay 440a is closed after receiving an opening signal. For example, the microcontroller 410 may provide an opening signal via the relay open input 414. The microcontroller 410 may receive an output signal from the relay sense circuit 430 indicating that the relay 440a is closed, and compare the output signal to stored information indicating the actuation delay of the relay 440a. Based on the comparison, the microcontroller 410 may determine that the relay 440a has remained closed longer than the associated actuation delay, and may generate an additional opening signal on the relay open input 414.

Automatic Addressing of Relays

In some implementations, a lighting relay panel includes one or more relay control boards. A relay control board may include one or more interfaces that are capable of connecting to respective relays (such as relays 140a-140d as described in regards to FIG. 1). In addition, the relay control board may include a microcontroller (such as microcontroller 135 as described in regards to FIG. 1) that is capable of configuring the relays based on one or more received inputs. In some cases, the microcontroller determines an addressing schema for the one or more relays. For example, the addressing schema may indicate an address that identifies a particular one of the relays. The addressing schema may indicate an address for each relay that is connected to the relay control board. In addition, the addressing schema may indicate additional addresses for additional relays that are connected to additional relay control boards. For example, an addressing schema may indicate addresses for relays that are connected to multiple relay control boards that are connected together. A non-limiting example configuration for connecting multiple relay control boards is a sequential (e.g., "daisy chain") configuration, but other connection types are possible.

In some cases, data may be provided to the particular relay or to the microcontroller based on the address for the particular relay. The data may include information that is intended to be received by (or on behalf of) the particular relay, and that should not be received by (or on behalf of) any of the other relays connected to the relay board(s). For example, data describing configuration information for the particular relay may be received by the microcontroller (e.g., on behalf of the particular relay). Based on the received data, the microcontroller may configure the particular relay, such as setting a configured state as described in regards to FIG. 7. It may be desirable for each relay connected to a relay control board to have an address that is unique compared to other relays that are included in the lighting relay panel. Assigning unique addresses to relays included in a lighting relay panel may improve reliability of the panel's operation, such as by providing data to only the relay(s) to which the data is addressed. In addition, it may be desirable for the addresses of relays included in a lighting relay panel to be automatically determined, such as by a microcontroller on a relay control board. Automatic addressing of relays in a panel may reduce the time related to installation and configuration of the lighting relay panel, and may reduce sources of user frustration or user errors.

Figure 5:
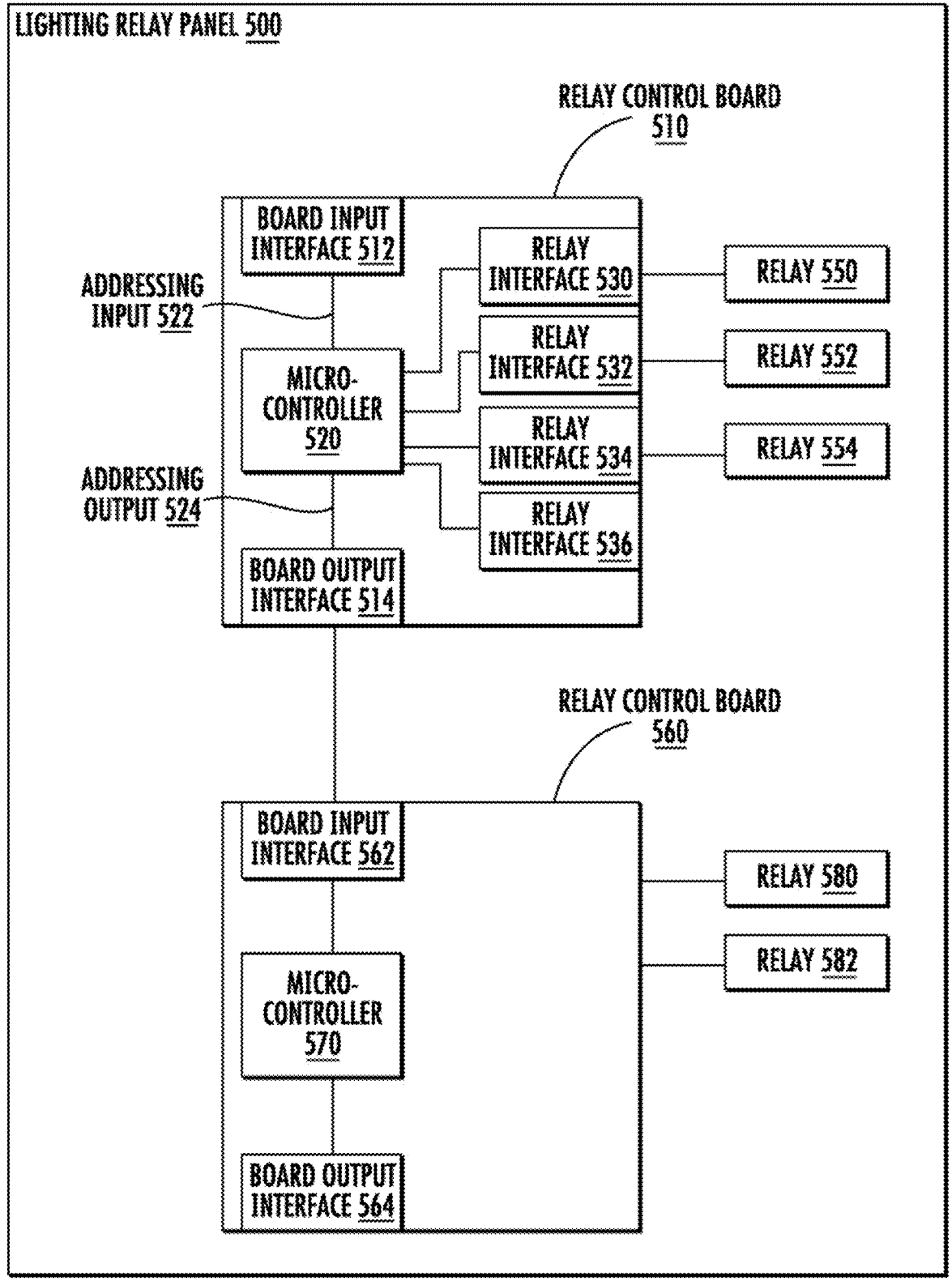
FIG. 5 is a block diagram depicting an example of a lighting relay panel in which one or more relays may be automatically addressed, according to some implementations.

FIG. 5 is a block diagram depicting an example of a lighting relay panel 500 in which one or more relays may be automatically addressed. The lighting relay panel 500 may include one or more relay control boards, such as relay control boards 510 and 560. FIG. 5 depicts the lighting relay panel 500 with two relay control boards 510 and 560 in a single-column configuration, but other implementations are possible, including configuration with more or fewer relay control boards, arranged in single- or multi-column configurations.

In addition, the lighting relay panel 500 may include one or more relays, such as relay 550, relay 552, relay 554, relay 580, and relay 582. The relays 550, 552, 554, 580, and 582 may be latching relays, but other types of relays are possible. In addition, the relay control boards 510 and 560 may each include one or more microcontrollers, such as respective microcontrollers 520 and 570, that are capable of communicating with one or more of the relays. For example, the relay control board 510 may include a microcontroller 520 that is capable of communicating with the relays 550, 552, or 554.

In addition, the relay control boards 510 and 560 may each include an arrangement of relay connections. The relay connections may include a wired or wireless interface, a communication protocol, or any other suitable technique. The microcontrollers 520 and 570 may be capable of communicating with the relays via the connections. For example, the relay control board 510 includes relay interfaces 530, 532, 534, and 536. The relay 550 may connect to the relay control board 510 via interface 530, the relay 552 may connect via interface 532, and the relay 554 may connect via interface 534. The relay interfaces 530, 532, 534, and 536 may be arranged on the relay control board 510 such that each interface has a respective position on the board 510. In addition, the microcontrollers 520 and 570 may be configured to determine whether each connection in the arrangement has a relay connected to it. For example, microcontroller 520 may determine that each of the interfaces 530, 532, and 534 has a connected relay, but that interface 536 is unconnected to a relay.

In the lighting relay panel 500, the relay control boards 510 and 560 may each include either a board input interface, a board output interface, or both. For example, the relay control board 510 may receive inputs (e.g., voltage levels, current levels, digital signals) via a board input interface 512, and the inputs may be received by the microcontroller 520 or other components on the relay control board 510. In addition, the relay control board 510 may provide outputs (e.g., voltage levels, current levels, digital signals) via a board output interface 514, and the outputs may be received by an additional relay control board, such as relay control board 560, or other components within or external to the lighting relay panel 500.

In some cases, a microcontroller of a relay control board may determine a board position of the relay control board within the lighting panel. The board position may be determined based on an input voltage (or other suitable signal) received on a board input interface. In addition, the microcontroller may generate an adjusted voltage, based on the input voltage and an adjustment value. The adjusted voltage may be provided to an additional relay control board. The adjustment value may include one or more of an increment, a decrement, a multiplying factor, or any other suitable adjustment. In some cases, the adjustment value is repeatable, such that each microcontroller in a sequence of relay control board may apply a similar adjustment to generate a unique adjusted voltage. Based on the adjusted voltage received by each relay control board in the sequence, each relay control board may determine its own board position in the sequence.

For example, the relay control board 510 may receive an input voltage signal, such as from a power supply, via the input interface 512. The input voltage may be received by the microcontroller 520 via an addressing input 522 (e.g., an input pin on the microcontroller). Based on a voltage level of the input voltage (e.g., 0.5V), the microcontroller 520 may determine that the relay control board 510 has an initial board position within the lighting relay panel 500.

In addition, the microcontroller 520 may generate an adjusted voltage. For example (and not by way of limitation), the microcontroller 520 may generate an increased voltage based on the input voltage and an incremental voltage. The microcontroller 520 may provide the adjusted voltage, such as via an addressing output 524, to the output interface 514, and the relay control board 510 may provide the adjusted voltage to the board input interface 562 on relay control board 560. Based on the received adjusted voltage, the microcontroller 570 may determine that the relay control board 560 has a subsequent board position in the lighting relay panel 500. For example (and not by way of limitation), the microcontroller 570 may compare the adjusted voltage to known values of the input voltage (e.g., 0.5V) and the incremental voltage. Based on the comparison (e.g., determining that the input voltage has been incremented once), the microcontroller 570 may determine that the board position of relay control board 560 is second in a sequence in the lighting relay panel 500.

In some cases, a microcontroller on a relay control board may determine an addressing schema for one or more relays that are connected to the relay control board. In addition, the addressing schema may be based on a connection position of a relay connection in an arrangement on the relay control board, a board position of the relay control board in a sequence, or both. For example, the microcontroller 520 may determine an initial board position based on the input voltage, and a respective connection position of each relay interface 530, 532, 534, and 536. Based on one or more of the determined board position or the connection positions, the microcontroller 520 may generate a respective address for each of relays 550, 552, and 554. For example (and not by way of limitation), the microcontroller 520 may generate a first address "1:01" for relay 550, a second address "1:02" for relay 552, and a third address "1:03" for relay 554. In addition, the microcontroller 570 may determine a subsequent board position based on the adjusted voltage, and a respective connection position associated with the relays 580 and 582. Based on the determined board position and/or the connection positions, the microcontroller 570 may generate the addresses "2:01" and "2:02" for the respective relays 580 and 582. The example addresses are represented by text for convenience, but other representations are possible, including representations not intended for human interpretation. In some cases, the microcontroller 520 (or 570) may generate the addresses further based on a determination of whether a relay is connected to each one of the relay connections arranged on the relay control board 510 (or 560). For example, responsive to determining that no relay is connected to the relay interface 536, the microcontroller 520 may omit an address associated with relay interface 536 from a generated address schema.

In some implementations, one or more of the relay control boards 510 or 560 includes an input capable of receiving a loopback signal from an additional relay control board. The loopback signal may be received on a loopback input, such as an input included in a data bus (or another suitable input) between multiple relay control boards. For example, the output interface 514 on relay control board 510 may include a loopback input that is capable of receiving a loopback signal from the input interface 562 on relay control board 560. In addition, the output interface 564 on relay control board 560 may include an additional loopback input that is capable of receiving an additional loopback signal from an additional relay control board subsequent to the board 560. In some cases, the loopback signal may be a voltage level that is generated by a last relay control board in an arrangement of relay control boards in a lighting relay panel. In addition, the voltage level of the loopback signal may be based on an adjusted voltage indicating the board position of the last relay control board. For example, in the lighting relay panel 500, the relay control board 560 may generate a loopback signal based on the board position of the relay control board 560 (e.g., second in a sequence) and provide the loopback signal to an additional relay control board in the arrangement, such as relay control board 510.

In some cases, the loopback signal may indicate a quantity of subsequent relay control boards, or a quantity of relays connected to the subsequent boards, or both. In addition, the loopback voltage may indicate a configuration of the relay control boards (e.g., single column, double-column). For example, the microcontroller 520 may determine, based on a loopback signal received from relay control board 560, a quantity of subsequent relay control boards included in the lighting relay panel 500 (e.g., the board 560), and that the relay control boards are arranged in a single-column configuration. In some cases, each relay control board included in the lighting relay panel 500 is capable of determining a total number of relay control boards and/or relays within the panel 500, based on its own board position and the quantity of subsequent boards indicated by the loopback signal. In addition, the addressing schema generated by one or more of microcontrollers 520 or 570 may indicate the total number or configuration of relay control boards (or relays), or any suitable combination of these.

In some cases, the lighting relay panel 500, or one or more of the relay control boards 510 or 560, provide information about the addressing schema to a user interface device associated with the lighting relay panel 500. For example, the relay control board 510 may provide (e.g., via input interface 512 and/or output interface 514) data that indicates one or more of the addressing schema, the quantity of relay control boards, the quantity of relays, or any other suitable information. The data may be interpreted by a user interface device, such as a handheld computing device or a diagnostic tool, and provided to a user via a display or other output device.

Isolation Circuit with Dimming Control Over Extended Voltage Range

A control signal, such as a control signal provided to a lighting system component via a relay, may be isolated by an isolation circuit included in a lighting relay panel, such as the optocouplers 137a-137d in lighting relay panel 110 as described in regards to FIG. 1. The isolation circuit may provide an isolated signal based on the control signal and a reference voltage. In some implementations, a push-pull optocoupler may provide an isolated signal with a stable value (e.g., without variations caused by a ripple voltage). In addition, the push-pull optocoupler may provide the isolated signal to the comparator, without providing the isolated signal to a digital isolator or a digital-to-analog convertor. Thus, a lighting relay panel having a push-pull optocoupler may provide a stable isolated signal to a comparator in a dimming component in a lighting controller. In addition, the lighting relay panel with the push-pull optocoupler may be manufactured at a relatively lower cost, compared to a panel including a single-transistor optocoupler, a digital isolator, and a digital-to-analog converter. In some cases, an isolation circuit including a push-pull optocoupler may enable a wider range of control signals, such as by enabling a control signal with a maximum voltage level of about 10V and a minimum voltage level of about 0.05V.

Figure 6:
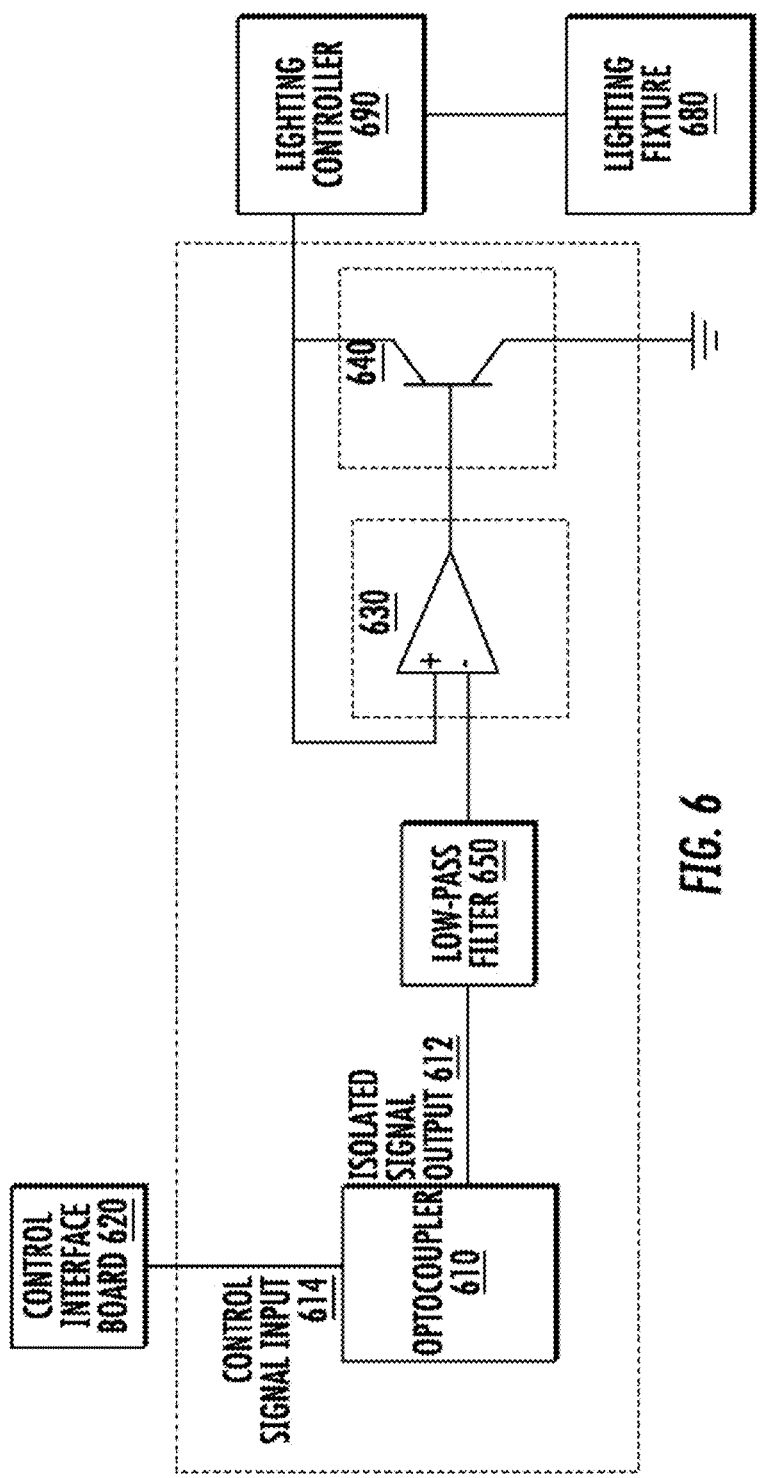
FIG. 6 is a block diagram depicting an example of an isolation circuit including an optocoupler, according to some implementations.

FIG. 6 includes a block diagram depicting an example of an isolation circuit 600. The isolation circuit 600 may include an optocoupler 610, such as a push-pull optocoupler. In some cases, the push-pull optocoupler 610 may generate a signal on an output on the isolated side of the optocoupler 610, such as on an isolated signal output 612. In addition, the isolated signal may be provided to a comparator 630. The comparator 630 may include an op-amp as depicted in FIG. 6, but other implementations are possible. In some cases, the isolation circuit 600 may include an optional low-pass filter 650, such that the isolated signal is provided to the low-pass filter 650 and a filtered isolated signal is received by the comparator 630. In some implementations, the optional low-pass filter 650 is omitted from the isolation circuit 600.

The push-pull optocoupler 610 may provide the isolated signal with an equal (or approximately equal) charge and discharge rate. For example, a control interface board 620 may provide a pulse width modulated (e.g., "PWM") signal, and the PWM signal may be received by the optocoupler 610, such as via a control signal input 614. In some cases, the PWM signal is received by other components, such as a relay or a relay control board as described elsewhere herein, and the optocoupler 610 receives the PWM signal (or a signal based on the PWM signal) via these one or more components.

The PWM signal may include a control signal by which one or more lighting system components are controlled. For example, a lighting controller 690 may receive the PWM signal (or the isolated signal based on the PWM signal) and control a lighting fixture 680 based on the signal. In addition, the lighting controller 690 may modify an operation of the lighting fixture 680, such as based on a duty cycle of the PWM signal (or the isolated signal). In some cases, the control signal may have a voltage range, such as 0-10V. In addition, the isolation circuit 600 may provide an isolated signal having an extended voltage range, such as from about 0.05V to about 10V.

The optocoupler 610 may provide the isolated signal based in part on the received PWM signal, such as by providing an isolated signal having a duty cycle that matches (or is otherwise based on) the duty cycle of the received PWM signal. In addition, the push-pull optocoupler 610 may provide the isolated signal with equal (or approximately equal) charge and discharge rates. For example, the duty cycle of the isolated signal provided by the push-pull optocoupler 610 may have rising and falling edges of approximately equal duration. In some cases, the isolated signal provided by the push-pull optocoupler 610 has charge and discharge rates that have less variation compared to charge and discharge rates of a signal provided by a single-transistor optocoupler. In addition, the push-pull optocoupler 610 may be faster and/or less sensitive to temperature changes than a single-transistor optocoupler. In some cases, the push-pull optocoupler 610 may provide the isolated signal without a bleeder resistor, such that the charge and discharge rate of the push-pull optocoupler 610 is less variable across multiple voltage levels (e.g., of the PWM signal) as compared to a charge and discharge rate of a single-transistor optocoupler.

In the isolation circuit 600, the comparator 630 may drive a transistor 640 based on the isolated signal. In addition, the comparator 630 may receive a feedback input from an output of the transistor 640. FIG. 6 depicts the transistor 640 as having a connection to ground, but other implementations are possible. In some implementations, a minimum voltage provided to the lighting controller 690 may be determined in part based on the forward voltage drop across the transistor 640, such as between the emitter and base of the transistor 640. In some cases, the transistor 640 may include an NPN transistor, the NPN transistor having a forward voltage drop of about 0.05V to about 0.2V. The NPN transistor may provide control signals to the lighting controller 690 from a minimum voltage of about 0.05V to a maximum voltage of about 10V. In addition, the transistor 640 may include a PNP transistor, the PNP transistor having a forward voltage drop of about 0.6 to about 0.8V. The PNP transistor may provide control signals to the lighting controller 690 from a minimum voltage of about 0.6V to a maximum voltage of about 10V.

In some cases, the transistor 640 including the NPN transistor may provide a greater range of control signals to the lighting controller 690. In some cases, the NPN transistor may enable a wider voltage range of control signals for the lighting controller 690, such as from a minimum voltage of about 0.05V to a maximum voltage of about 10V. In addition, the NPN transistor may enable a voltage range of control signals closer to a value of zero volts. For example, the NPN transistor may enable control signals with a minimum value of 0.05V, based on the forward voltage drop across the NPN transistor. The PNP transistor may enable control signals with a minimum value of 0.6V, based on the forward voltage drop across the PNP transistor.

Configurable Relays for Performance During Power Interruptions

In some implementations, a lighting relay panel has one or more relays, such as the lighting relay panel 110 and relays 140*a*-140*d* described in regards to FIG. 1. The relay may be configured to enter or maintain a state while receiving power and/or when power to the relay is interrupted. The states of the relays may include, for example, closed, open, or momentary operation (e.g., "MOM"). In some cases, a relay may be configured to have one or more of a first state while receiving power, a second state while power is interrupted, or a third state upon changing between receiving and not receiving power.

In some implementations, a relay may enable or disable a connection that is capable of providing power or control signals to a component in a lighting system. In addition, the relay may enable or disable the connection based on whether power is received by the relay panel. For example, while power is supplied to the relay panel, a closed relay may enable a connection between a power supply or a control component (such as power supply 120 or control interface board 112 described in regards to FIG. 1) and an additional lighting system component (such as one of lighting controllers 190*a*-190*d* described in regards to FIG. 1). The closed relay may enable the connection while power is supplied to the relay panel. For example (and not by way of limitation), if power to the lighting relay panel is interrupted (e.g., a reset command, a brownout event, a surge event), the relay may open, and disable the connection between the power supply and the lighting system component (e.g., while the power supply is unpredictable). In addition, while power is supplied to the panel, an open relay may disable a connection between the power supply or the control component an emergency power supply, such as a battery, and the lighting system component. For example (and not by way of limitation), if power to the lighting relay panel is interrupted, the relay may close, and enable a connection between the component and an emergency power supply, such as a battery.

A relay panel may use electrically held relays, such as relays that hold an activated state while receiving power and return to a deactivated state when power to the electrically held relay is interrupted. In some cases, a lighting relay panel with configurable latching relays may offer improved operation, such as by allowing the user to select one of multiple modes of operation. In addition, a lighting relay panel with configurable latching relays may be configured (or reconfigured) for multiple uses more readily than a panel with electrically held relays. For example, the user may wish to try several different types of lighting configurations, or to configure the panel for non-lighting uses (e.g., small-motor controls). Such improvements in configurability may also result in reductions in cost and waste material during, for example, renovations or reconfiguration of lighting at a premises.

Figure 7:
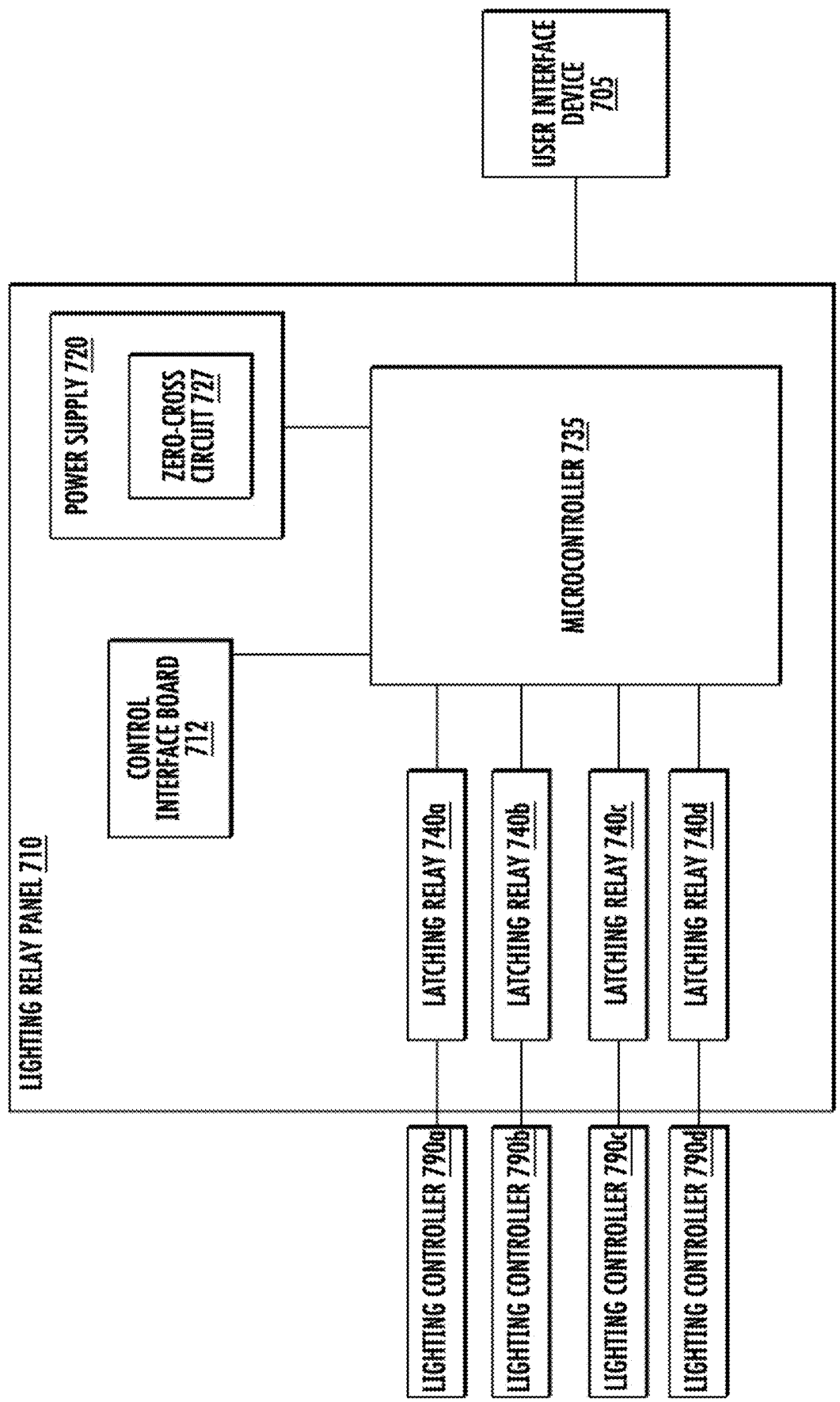
FIG. 7 is a block diagram depicting an example of a lighting relay panel that includes one or more configurable latching relays, according to some implementations.

FIG. 7 includes a block diagram depicting a lighting relay panel 710 that includes one or more configurable latching relays, such as latching relays 740*a*-740*d*. In addition, the latching relays 740*a*-740*d* may be configured to enable or disable a connection between lighting system components that provide power and/or control signals, and lighting system components that receive the power and/or control signals. For example, the lighting relay panel 710 may include one or more of a power supply 720 or a control interface board 712. Each of the latching relays 740*a*-740*d* may be configured to enable (or disable) a connection between the control interface board 712 and a respective one of the lighting controllers 790a-690d. In addition, each of the latching relays 740a-740d may be configured to enable (or disable) a connection between the power supply 720 and the respective lighting controller.

In some cases, the latching relays 740a-740d may be configured to have one of multiple states, such as open, closed, or MOM states. In some cases, the configuration may be responsive to signals provided by a microcontroller 735 that is included in the relay panel 710. In addition, the configuration may be performed based on information received by the microcontroller 735. Responsive to the information, the microcontroller 735 may perform operations related to configuring the latching relays 740a-740d. For example, a user may provide a configuration input via a user interface device 705. In addition, a program comprising executable instructions may be provided via the control interface board 712. Furthermore, the microcontroller 735 may receive the information via another suitable technique.

In some implementations, the latching relays 740a-740d are configurable via the user interface device 705. The user input device 705 may include an input/output device, such as a handheld diagnostic tool or a personal computing device. In addition, the user input device 705 may provide a user interface by which the latching relays 740a-740d are configured. For example, the user input device 705 may communicate with the microcontroller 735. The microcontroller 735 may include computer-executable code (e.g., firmware) that describes one or more values, operations, or other data types describing a respective configuration of each of the latching relays 740a-740d. In addition, the microcontroller 735 may receive inputs that modify a respective configuration of one or more of the latching relays 740a-740d. In some cases, each latching relay may be configured to have open, closed, or MOM state. In addition, each latching relay may be configured to have a particular state responsive to particular power event (e.g., brownout, power surge). For example, and not by way of limitation, the latching relay 740a may be configured to have an open state during a power surge, such as to withhold power from the associated lighting controller 790a. In addition, the latching relay 740a may be configured to have a closed state during normal operation, such as to provide power to the lighting controller 790a. In addition, the latching relay 740a may be configured to have a MOM state during a change in power supply (e.g., a change from normal power supply to brownout), such as to provide a momentary (e.g., about 1 second) pulse of power to the associated lighting controller 790a (e.g., to trigger a shade control fixture or other motorized fixture).

In some cases, each of the latching relays 740a-740d maintains a configured state, such as by holding a position of a mechanical latch within the respective relay. The configured state may be configured via the microcontroller 735. In addition, the configured state may be maintained during an interruption in power, such as by holding the latch position during the interruption. In some cases, configuring a latching relay requires a relatively small pulse of power (e.g., 0.5 W, pulse of 100 mA at 5V). An electrically held relay, such as in a conventional panel, may require a constant input of power to maintain an activated state. In some cases, a latching relay may offer an improvement in power consumption as compared to an electrically held relay. In addition, the lighting relay panel 710 may include a capacitor or battery, such as to change the state of one or more of the latching relays 740a-740d during a power event. As the latching relays 740a-740d require a relatively small pulse of power to change configuration, a relatively small capacitor or battery may provide enough power to reconfigure one of the latching relays even during the power event.

In some cases, each of the latching relays 740a-740d are individually addressed, such as described with regards to FIG. 5, and may be individually configured for operation during power events. For example, the latching relays 740a, 740b, and 740c could be configured to have an open state during a power event, such that power is withheld from the lighting controllers 790a, 790b, and 790c, while the latching relay 740d could be configured to have a closed state during a power event, such as to provide the lighting controller 790d with power (e.g., from an emergency backup battery).

In some implementations, the latching relays 740a-740d may be configured to enter or maintain a configured state during a brownout event. For example, the power supply 720 may include a zero-cross circuit 727. The zero-cross circuit 727 may monitor an AC power signal received from a power source (e.g., from AC line power), and determine when the AC power signal crosses a zero point, such as a zero point in a sinusoidal waveform of the AC signal. In addition, the zero-cross circuit 727 may provide to the microcontroller 735 data describing the zero-crossings, such as a time or window in time of when each crossing occurs.

Based on the data received from the zero-cross circuit 727, the microcontroller 735 may determine that one or more zero-crossings have been missed (e.g., the AC signal did not cross zero at an expected time). In addition, the microcontroller 735 may determine, based on the missed zero-crossings, that the AC signal has been interrupted. For example, and not by way of limitation, the microcontroller 735 may determine a brownout state based on a threshold quantity of missed zero-crossings within a window of time (e.g., three missed crossings within one second). In some cases, the microcontroller may determine additional power events (e.g., blackout, power surges) based on additional data from the zero-cross circuit 727 or the power supply 720. For example, the power supply 720 may provide a signal indicating a voltage or current level received by the power supply 720, and the microcontroller may determine a power event based on the signal indicating a voltage or current level outside of a range of expected levels. Responsive to determining the brownout (or other power event), the microcontroller 735 may perform operations related to configuring the latching relays 740a-740d. For example, the microcontroller 735 may configure one or more of the latching relays 740a-740d to have a state associated with the brownout, such as an open relay state.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter. Different arrangements of the components or features depicted in the drawings or described above are possible, as well as arrangements with components or not shown or described. Similarly, some features and sub-combinations are useful and may be employed without reference to other features and sub-combinations. The exemplary systems represented here may be implemented independently, in conjunction with one or more different ones of the systems described above, or in conjunction with a system not described herein.

The components, features, and techniques described herein are discussed with respect to lighting systems, such as for lighting control systems. However, other uses are possible, such as for control systems related to motors (e.g., shade controls, motorized pivots), audio or video systems, security systems, or any other suitable control system. In some cases, a lighting relay panel may be rated as a component for a Class 2 or low-voltage controls electrical system, but other implementations or ratings are possible.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art.

What is claimed is:

1. A relay control board comprising:
    an arrangement of multiple relay connections, wherein
        each respective connection of the multiple relay connections has a respective position in the arrangement on the relay control board, and
    a microcontroller, wherein the microcontroller is configured to:
        receive an input voltage on an addressing input to the microcontroller;
        determine, based on the input voltage, that the relay control board has a board position in a lighting control panel;
        receive, via a first connection of the multiple relay connections, an indication that a relay is connected to the first connection;
        generate an address associated with the relay, the address based on the respective position of the first connection and further based on the board position of the relay control board in the lighting control panel;
        generate an adjusted voltage based on the input voltage and an adjustment value, wherein the adjustment value indicates the board position of the relay control board in the lighting control panel; and
        provide the adjusted voltage to an additional relay control board included in the lighting control panel.

2. The relay control board of claim 1, wherein the microcontroller is further configured to:
    determine, based on the input voltage, that the board position of the relay control board is an initial board position in the lighting control panel,
    wherein the generated address is further based on the initial board position of the relay control board in the lighting control panel.

3. The relay control board of claim 1, wherein the adjustment value is one of: an incremental increase, an incremental decrease, a multiplying factor, or a digital signal adjustment.

4. The relay control board of claim 1, wherein the microcontroller is further configured to:
    determine, based on the input voltage, that a second additional relay control board is included in the lighting control panel; and
    determine, based on the input voltage, that the second additional relay control board has an initial position in the lighting control panel, and the relay control board has a subsequent position in the lighting control panel,
    wherein the generated address is further based on the subsequent position of the relay control board in the lighting control panel.

5. The relay control board of claim 1, wherein the microcontroller is further configured to:
    determine that the input voltage is based on a combination of a reference voltage and an additional adjustment value,
    wherein generating the adjusted voltage is further based on the reference voltage.

6. The relay control board of claim 1, wherein the microcontroller is further configured to provide the adjusted voltage to the additional relay control board included in the lighting control panel, the additional relay control board having a subsequent board position in the lighting control panel.

7. The relay control board of claim 1, wherein the microcontroller is further configured to:
    receive a loopback signal on a loopback input to the microcontroller; and
    determine, based on the loopback signal, a quantity of relay control boards included in the lighting control panel.

8. The relay control board of claim 1, wherein the microcontroller is further configured to:
receive a loopback signal on a loopback input to the microcontroller; and
determine, based on the loopback signal, a configuration of relay control boards included in the lighting control panel.

9. The relay control board of claim 1, wherein the microcontroller is further configured to provide the generated address to a user interface device associated with the lighting control panel.

10. A method of automatically determining an address on a relay control board, the method comprising:
receiving an input voltage on an addressing input to a microcontroller included in a relay control board,
determining, based on the input voltage, that the relay control board has a board position in a lighting control panel,
receiving, via a first relay connection of the relay control board, an indication that a relay is connected to the first relay connection,
generating an address associated with the relay, the address based on a respective position, on the relay control board, of the first relay connection and further based on the board position of the relay control board in the lighting control panel;
generating an adjusted voltage based on the input voltage and an adjustment value, wherein the adjustment value indicates the board position of the relay control board in the lighting control panel; and
providing the adjusted voltage to an additional relay control board included in the lighting control panel.

11. The method of claim 10, further comprising:
determining, based on the input voltage, that the board position of the relay control board is an initial board position in the lighting control panel,
wherein the generated address is further based on the initial board position of the relay control board in the lighting control panel.

12. The method of claim 10, wherein the adjustment value is one of: an incremental increase, an incremental decrease, a multiplying factor, or a digital signal adjustment.

13. The method of claim 10, further comprising:
determining, based on the input voltage, that a second additional relay control board is included in the lighting control panel; and
determining, based on the input voltage, that the second additional relay control board has an initial position in the lighting control panel, and the relay control board has a subsequent position in the lighting control panel,
wherein the generated address is further based on the subsequent position of the relay control board in the lighting control panel.

14. The method of claim 10, further comprising:
determining that the input voltage is based on a combination of a reference voltage and an additional adjustment value,
wherein generating the adjusted voltage is further based on the reference voltage.

15. The method of claim 10, further comprising providing the adjusted voltage to the additional relay control board included in the lighting control panel, the additional relay control board having a subsequent board position in the lighting control panel.

16. The method of claim 10, further comprising:
receiving a loopback signal on a loopback input to the microcontroller; and
determining, based on the loopback signal, a quantity of relay control boards included in the lighting control panel.

17. The method of claim 10, further comprising:
receiving a loopback signal on a loopback input to the microcontroller; and
determining, based on the loopback signal, a configuration of relay control boards included in the lighting control panel.

18. The method of claim 10, further comprising providing the generated address to a user interface device associated with the lighting control panel.

19. A relay control board comprising:
an arrangement of multiple relay connections, wherein each respective connection of the multiple relay connections has a respective position in the arrangement on the relay control board, and
a microcontroller, wherein the microcontroller is configured to:
receive an input voltage on an addressing input to the microcontroller;
determine, based on the input voltage, that (i) the relay control board has a board position in a lighting control panel and (ii) an additional relay control board has an initial position in the lighting control panel, wherein the board position of the relay control board is subsequent to the initial position of the additional relay control board;
generate respective addresses associated with each of the multiple relay connection positions, each respective address based on the respective position of the respective connection and further based on the board position of the relay control board in the lighting control panel.

20. The relay control board of claim 19, wherein the microcontroller is further configured to:
generate an adjusted voltage based on the input voltage and an adjustment value, wherein the adjustment value indicates the board position of the relay control board in the lighting control panel; and
provide the adjusted voltage to a second additional relay control board included in the lighting control panel.

* * * * *